United States Patent
Shon

(10) Patent No.: US 10,416,207 B2
(45) Date of Patent: Sep. 17, 2019

(54) ELECTRIC ENERGY INFORMATION PROVISION SYSTEM AND METHOD THEREOF

(71) Applicant: LSIS CO., LTD., Gyeonggi-do (KR)

(72) Inventor: Sang-Ki Shon, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 97 days.

(21) Appl. No.: 15/213,708

(22) Filed: Jul. 19, 2016

(65) Prior Publication Data
US 2017/0030951 A1    Feb. 2, 2017

(30) Foreign Application Priority Data
Jul. 28, 2015    (KR) .................. 10-2015-0106902

(51) Int. Cl.
*G01R 21/133* (2006.01)
*G08B 5/22* (2006.01)
(Continued)

(52) U.S. Cl.
CPC .......... *G01R 21/133* (2013.01); *G01R 22/00* (2013.01); *G06Q 50/06* (2013.01); *G06T 11/206* (2013.01); *G08B 5/223* (2013.01); *H04Q 9/00* (2013.01); *H04Q 2209/60* (2013.01); *H04Q 2209/826* (2013.01)

(58) Field of Classification Search
CPC ........ G01R 21/133; G01R 22/00; H04Q 9/00; H04Q 2209/826; H04Q 2209/60; G06T 11/206; G08B 5/223; G06Q 50/06
See application file for complete search history.

(56) References Cited

U.S. PATENT DOCUMENTS

| 4,298,839 A * | 11/1981 | Johnston ............. G01R 21/133 324/157 |
| 6,366,889 B1 * | 4/2002 | Zaloom ................. G06Q 10/04 705/7.37 |

(Continued)

FOREIGN PATENT DOCUMENTS

| CN | 101354408 A | 1/2009 |
| CN | 201332267 Y | 10/2009 |

(Continued)

OTHER PUBLICATIONS

Kadar, Smart meter based energy management system, Apr. 2011, IEEE, p. 1160-1163.*

(Continued)

*Primary Examiner* — Mohammad K Islam
(74) *Attorney, Agent, or Firm* — K&L Gates LLP

(57) ABSTRACT

In some embodiments, an electric energy information provision method includes measuring electric energy, analyzing the measured electric energy to generate electric energy information, and displaying the generated electric energy information in response to a request of a user. The electric energy information may include a variation status, a standard deviation analysis result, a dispersion deviation analysis result, trend line information, past accumulative electric energy variation information, anticipated future accumulative electric energy variation information, an electric energy usage status diagnosis, and electric energy reduction plan information.

5 Claims, 6 Drawing Sheets

(51) Int. Cl.
  *H04Q 9/00* (2006.01)
  *G06T 11/20* (2006.01)
  *G01R 22/00* (2006.01)
  *G06Q 50/06* (2012.01)

(56) References Cited

U.S. PATENT DOCUMENTS

| | | | |
|---|---|---|---|
| 9,825,464 B2* | 11/2017 | Lee | H02J 3/14 |
| 2005/0068192 A1* | 3/2005 | Rogai | G01D 4/004 |
| | | | 340/870.02 |
| 2005/0096797 A1* | 5/2005 | Matsubara | H02J 3/00 |
| | | | 700/291 |
| 2006/0267574 A1 | 11/2006 | Howard | |
| 2007/0203860 A1 | 8/2007 | Golden et al. | |
| 2008/0033892 A1* | 2/2008 | Neri-Badillo | G06Q 30/0283 |
| | | | 705/412 |
| 2011/0046792 A1* | 2/2011 | Imes | F24F 11/63 |
| | | | 700/278 |
| 2011/0153101 A1* | 6/2011 | Thomas | G06Q 10/04 |
| | | | 700/291 |
| 2011/0218690 A1* | 9/2011 | O'Callaghan | G06Q 10/06 |
| | | | 700/295 |
| 2011/0264286 A1 | 10/2011 | Park | |
| 2012/0004872 A1* | 1/2012 | Oh | G01D 3/10 |
| | | | 702/62 |
| 2012/0065791 A1* | 3/2012 | Besore | G06Q 10/04 |
| | | | 700/291 |
| 2012/0089269 A1* | 4/2012 | Weaver | H02J 3/14 |
| | | | 700/295 |
| 2012/0109393 A1* | 5/2012 | Kosaka | G06Q 10/06 |
| | | | 700/291 |
| 2012/0136499 A1* | 5/2012 | Jang | G06Q 10/00 |
| | | | 700/297 |
| 2012/0166233 A1* | 6/2012 | Wengrovitz | G06Q 10/063 |
| | | | 705/7.11 |
| 2012/0205977 A1 | 8/2012 | Shin et al. | |
| 2013/0297084 A1* | 11/2013 | Kubota | H01M 10/44 |
| | | | 700/286 |
| 2014/0201110 A1 | 7/2014 | Sato | |
| 2014/0316958 A1* | 10/2014 | Alberth, Jr. | G06Q 10/00 |
| | | | 705/35 |
| 2014/0340075 A1 | 11/2014 | Doi et al. | |
| 2015/0149249 A1* | 5/2015 | Mansfield | G06Q 30/0205 |
| | | | 705/7.31 |
| 2015/0266391 A1* | 9/2015 | Hostyn | B60L 53/305 |
| | | | 701/22 |
| 2015/0319056 A1* | 11/2015 | Inoue | G06Q 30/04 |
| | | | 709/224 |
| 2015/0323948 A1* | 11/2015 | Jeong | G05B 15/02 |
| | | | 700/291 |
| 2015/0355247 A1* | 12/2015 | Choe | G01R 21/133 |
| | | | 702/60 |
| 2017/0030951 A1* | 2/2017 | Shon | G01R 21/133 |
| 2017/0108904 A1* | 4/2017 | Choi | G06Q 50/06 |
| 2017/0140482 A1* | 5/2017 | Salter | G06Q 50/06 |
| 2017/0344044 A1* | 11/2017 | Imes | F24F 11/63 |
| 2018/0006492 A1* | 1/2018 | Kim | G06Q 50/06 |

FOREIGN PATENT DOCUMENTS

| | | |
|---|---|---|
| CN | 102279297 A | 12/2011 |
| CN | 102387192 A | 3/2012 |
| CN | 102436731 A | 5/2012 |
| CN | 102928809 A | 2/2013 |
| CN | 103606018 A | 2/2014 |
| JP | 2002-189779 A | 7/2002 |
| JP | 2002189779 A | 7/2002 |
| JP | 4073946 B1 | 4/2008 |
| JP | 2013131148 A | 7/2013 |
| JP | 2013228891 A | 11/2013 |
| JP | 2013235322 A | 11/2013 |
| JP | 2014130015 A | 7/2014 |
| KR | 10-0821825 B1 | 4/2008 |
| KR | 10-0913125 B1 | 8/2009 |
| KR | 10-2010-0079474 A | 7/2010 |
| KR | 10-0979410 B1 | 9/2010 |
| KR | 10-2011-0053841 A | 5/2011 |
| KR | 10-2011-0070654 A | 6/2011 |
| KR | 101079929 B1 | 11/2011 |
| KR | 10-2011-0132844 A | 12/2011 |
| KR | 10-1203949 B1 | 11/2012 |
| KR | 20130001776 A | 1/2013 |
| KR | 20140077416 A | 6/2014 |
| KR | 10-1439257 B1 | 9/2014 |
| WO | 2011024366 A1 | 3/2011 |

OTHER PUBLICATIONS

Japanese Office Action dated Aug. 1, 2017 corresponding to application No. 2016-146456.
Korean Office Action for related Korean Application No. 10-2015-0106902; action dated Dec. 5, 2018; (7 pages).
Chinese office Action for related Chinese Application No. 201610597584.4; action dated Jul. 30, 2018; (9 pages).
European search report dated Dec. 22, 2016 for corresponding EP application 16174280.4.
Chinese Office Action for related Chinese Application No. 201610597584.4; action dated Apr. 30, 2019; (8 pages).

* cited by examiner

ELECTRIC ENERGY INFORMATION PROVISION SYSTEM AND METHOD THEREOF

CROSS REFERENCE TO RELATED APPLICATIONS

This application claims the benefit of Korean Patent Application No. 10-2015-0106902, filed on Jul. 28, 2015 and entitled "ELECTRIC ENERGY INFORMATION PROVISION SYSTEM AND METHOD THEREOF", which is hereby incorporated by reference in its entirety.

BACKGROUND

Technical Field

The present disclosure relates to an electric energy information provision system and a method thereof.

Description of the Related Art

In every building, an electricity meter is installed to indicate electric energy being currently used by digits.

Recently, a system of displaying electric energy information over time has been proposed.

However, such a system merely provides a user with electric energy used per hour and does not provide further information more than the electric energy, so that efficiency of an information provision is degraded.

SUMMARY

Therefore, an object of some embodiments of the present disclosure is to address the problems described above and other problems.

Another object of some embodiments of the present disclosure is to provide an electric energy information provision system capable of providing a user with an effective electric energy, and a method thereof.

In accordance with one aspect of some embodiments of the present disclosure to attain the objects or other objects, an electric energy information provision method includes measuring electric energy, analyzing the measured electric energy to generate electric energy information, and displaying the generated electric energy information in response to a request of a user. The electric energy information may include a variation status, a standard deviation analysis result, a dispersion deviation analysis result, trend line information, past accumulative electric energy variation information, anticipated future accumulative electric energy variation information, an electric energy usage status diagnosis, and electric energy reduction plan information.

In accordance with another aspect of some embodiments of the present disclosure, an electric energy information provision system includes an electricity meter to measure electric energy, and an electric energy analysis device configured to analyze the measured electric energy to generate electric energy information and transmit the electric energy information to a user in response to a request therefrom.

Effectiveness of a terminal according to some embodiments of the present disclosure is as follows.

In accordance with at least one of the embodiments of the present disclosure, a variety of information related to electric energy may be displayed as described above instead of simply showing electric energy over time. Consequently, there are advantages in that an electric energy usage custom of a user may be improved and also a reduction of electric energy of the user may be guided.

An additionally applicable range of some embodiments of the present disclosure will be apparent from the following description. However, it should be clearly understood that various modifications and alterations can be devised by those skilled in the art, and, therefore, the detailed description and specific embodiment such as the embodiments of the present disclosure should be construed as illustrative embodiments thereof.

DETAILED DESCRIPTION

Figure 1:
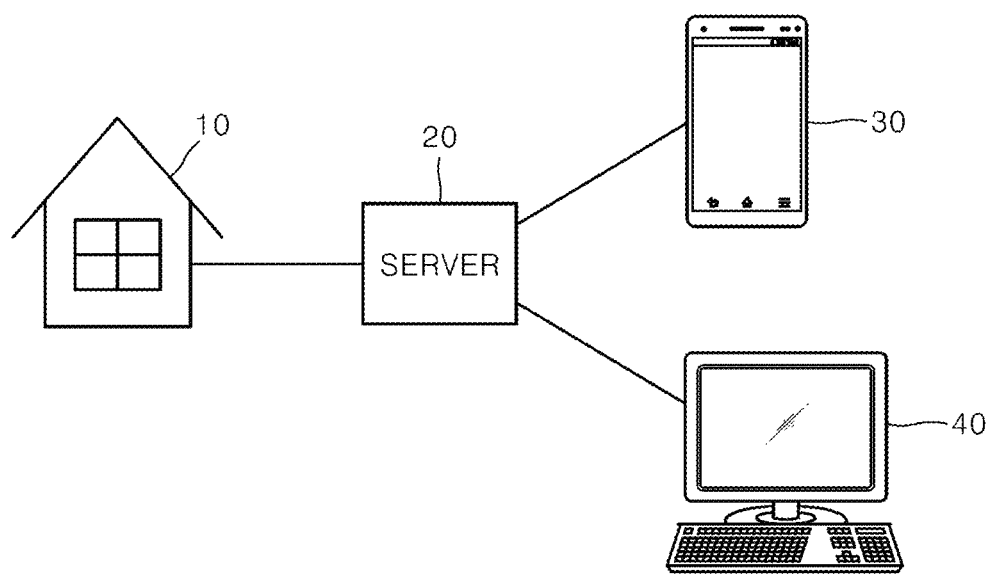
FIG. 1 is a diagram illustrating an electric energy information provision system according to a first embodiment of the present disclosure.

Hereinafter, embodiments disclosed herein will be described in detail with reference to the accompanying drawings, and the same or like components refer to the same reference numerals regardless of given reference numerals and duplicated description thereof will be omitted. In the following description, the terms of "module" and "unit" with respect to components are merely given by considering only easiness of describing the present disclosure, and these terms themselves do not represent specific meanings or functions. Also, in describing embodiments of the present disclosure described herein, if a detailed description of known functions and configurations is determined to obscure the interpretation of embodiments of the present disclosure, the detailed description thereof will be omitted. In addition, the accompanying drawings may be merely intended to describe the embodiments disclosed therein in an easy manner and may not represent all technical spirits of the present disclosure, and it should be construed to include numerous other modifications, equivalents and alternations within the spirit and the technical scope of the present disclosure.

FIG. 1 is a diagram illustrating an electric energy information provision system according to a first embodiment of the present disclosure.

With reference to FIG. 1, an electric energy information provision system may include a sever 20, an electricity meter, and terminals 30 and 40. The server 20 may be a server connectable to a network such as a cloud, but it is not limited thereto.

The electricity meter may be installed at each of buildings 10, that is, at an indoor of each building, and measure electric energy consumed by a user of each of the buildings 10 to transmit the measured electric energy to the server 20.

The electricity meter may be installed at an indoor usage load, but it is not limited thereto. The indoor usage load may be an electric home appliance, for example, a refrigerator, a washing machine, a computer and the like.

The server 20 may generate electric energy information based on electric energy transmitted from the electricity meter of each of the buildings 10.

The electric energy information may be a generic term for information related to various electric energy generated using measured electric energy from the electricity meter of each of the buildings 10. For example, based on the measured electric energy, electric energy information such as an electric energy variation status, a standard deviation analysis result, a dispersion variance analysis result, trend line information, past accumulative electric energy variation information, anticipated future accumulative electric energy variation information, electric energy usage status diagnosis, electric energy decreasing plan information and the like may be generated.

The present disclosure is not limited thereto, and any kind of electric energy information to be helpful to a user may be generated.

The terminals 30 and 40 may connect to the server 20 and receive electric energy information provided from the server 20 to display the received electric energy information. For this purpose, a display device capable of displaying electric energy information thereon may be provided at the terminals 30 and 40.

The terminal may be a mobile terminal 30 or a fixed terminal 40. The mobile terminal 30 may include a mobile phone, a notebook, a tablet personal computer (PC), a watch-type terminal, a glass-type terminal and the like. The fixed terminal 40 may include a desk-top PC and the like.

The terminals 30 and 40 and the server 20 may be possible to transmit and receive information to and from each other using a wireless communication. For this purpose, each of the terminals 30 and 40 and the server 20 may include a wireless communication module.

For example, the terminals 30 and 40 may provide the server 20 with necessary information using an input/output device. For instance, a user of the terminals 30 and 40 may provide the server 20 with own personal information. The server 20 may store the personal information or identification information of the user of the terminals 30 and 40 together with an identification number of an electricity meter installed at the building at which the user resides. Therefore, electric energy information generated based on the measured electric energy from the electricity meter may be stored together with the personal information of the user of the terminals 30 and 40. When the user connects to the server 20 using the terminals 30 and 40 in a near future, the server 20 may perform a user authentication based on the personal data of the user. When the user authentication is successfully performed, the server 20 may transmit the electric energy information to the terminals 30 and 40 of the user.

Figure 2:
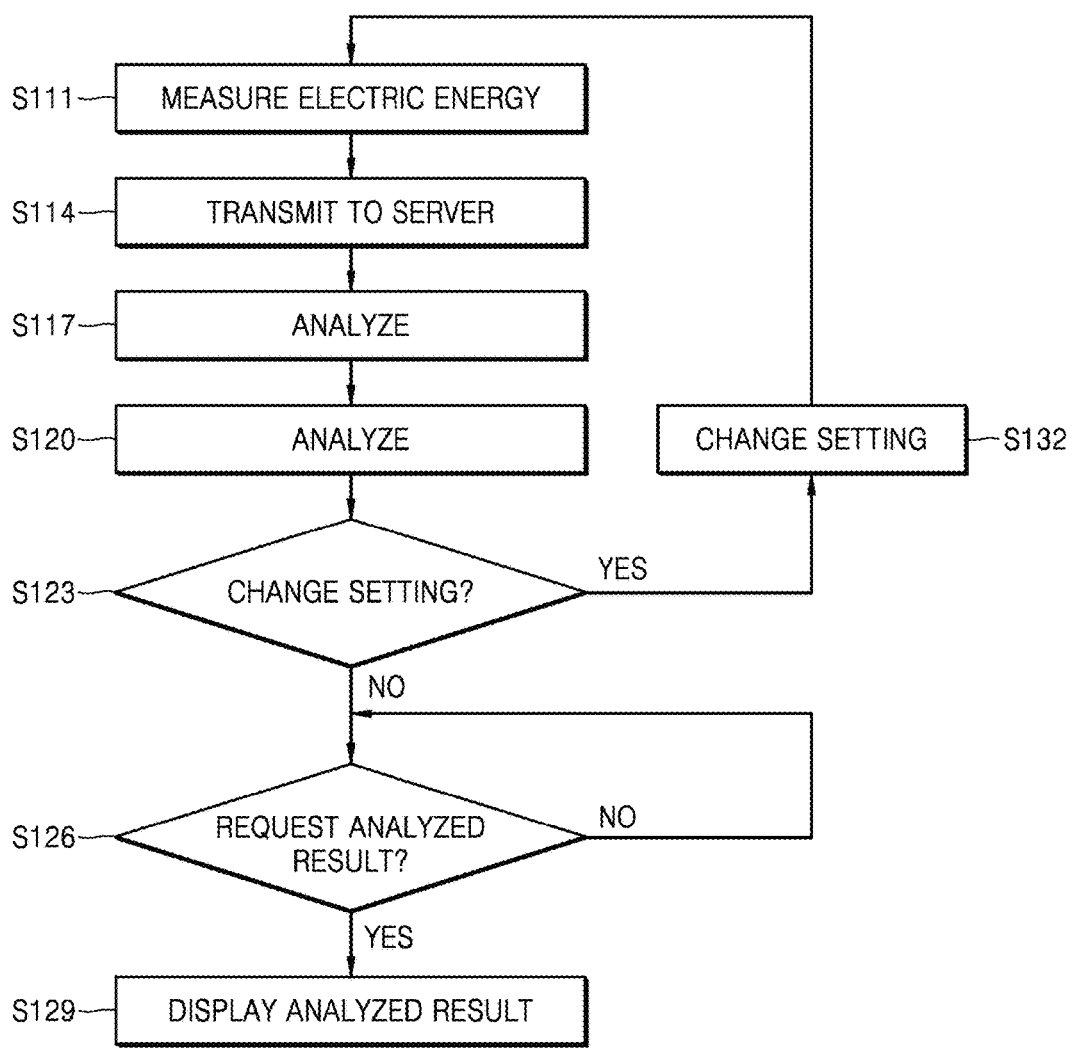
FIG. 2 is a flow chart for describing an electric energy information provision method according to an embodiment of the present disclosure.

FIG. 2 is a flow chart for describing an electric energy information provision method according to an embodiment of the present disclosure.

With reference to FIGS. 1 and 2, an electricity meter installed at the building 10 measures electric energy being used therein, that is, electric energy of an indoor usage load in Operation S111.

The electric energy may be measured in real time or in a periodical period. Here, the periodical period may be once a day or once a week, but it is not limited thereto.

The electricity meter transmits the measured electric energy to the server 20 in Operation S114. The measured electric energy may be immediately transmitted to the server 20 in real time when being measured, or may be transmitted thereto in a predetermined period. The predetermined period may be once a day or once a week, but it is not limited thereto.

The server 20 may analyze the transmitted electric energy to generate and analyze information related to various electric energy, that is, electric energy information in Operation S117.

An electric energy analysis may employ a standard deviation analysis, a variance analysis, an electric energy variation analysis and the like, but it is not limited thereto.

As described above, information related to electric energy may include an electric energy variation status, a standard deviation analysis result, a dispersion variance analysis result, trend line information, past accumulative electric energy variation information, future accumulative electric energy expected variation information, electric energy usage status diagnosis, electric energy decreasing plan information and the like, but it is not limited thereto.

The server 20 may store the electric energy information obtained from an analysis result together with the user identification information S120.

The user may change setting information registered at the server 20 at any time. That is, when an instruction for a setting change request is transmitted from the terminals 30 and 40 in Operation S123, the server 20 may respond to a setting change request from a user to change the preset information to a setting requested by the user. For example, when a progressive stage system is changed or an electricity unit price per time slot is changed, the user may request a setting change to a changed content using the terminals 30 and 40 at any time. According to such a setting change request of the user, the server 20 may change corresponding setting information to the setting change content requested by the user in Operation S132.

The terminals 30 and 40 may transmit an analysis result request of the user to the server 20 in Operation S126. That is, the user may connect to the server 20 using the terminals 30 and 40 at any time to request an electric energy analysis result of the user.

For example, the user may connect to the server 20 using the terminals 30 and 40 through a log-in process or a user authentication process. When the log-in process or the user authentication process is successfully completed, electric energy information stored in the server 20 may be accessible.

In response to the analysis result request of the user, the server 20 may transmit the corresponding analysis result, that is, the electric energy information to the terminals 30 and 40 of the user based on the identification number thereof. The electric energy information may be displayed on a display device provided at the terminals 30 and 40 of the user in Operation S129.

Therefore, the user may easily obtain the electric energy information using the terminals 30 and 40. In particular, instead of simply showing electric energy over time, the variety of information related to the electric energy may be displayed as described above. Through displaying the variety of information, an electric energy usage custom of the user may be improved and also a reduction of electric energy of the user may be guided.

Hereinafter, various analysis results, that is, electric energy information which are available from the server 20 will be described.

Figure 3:
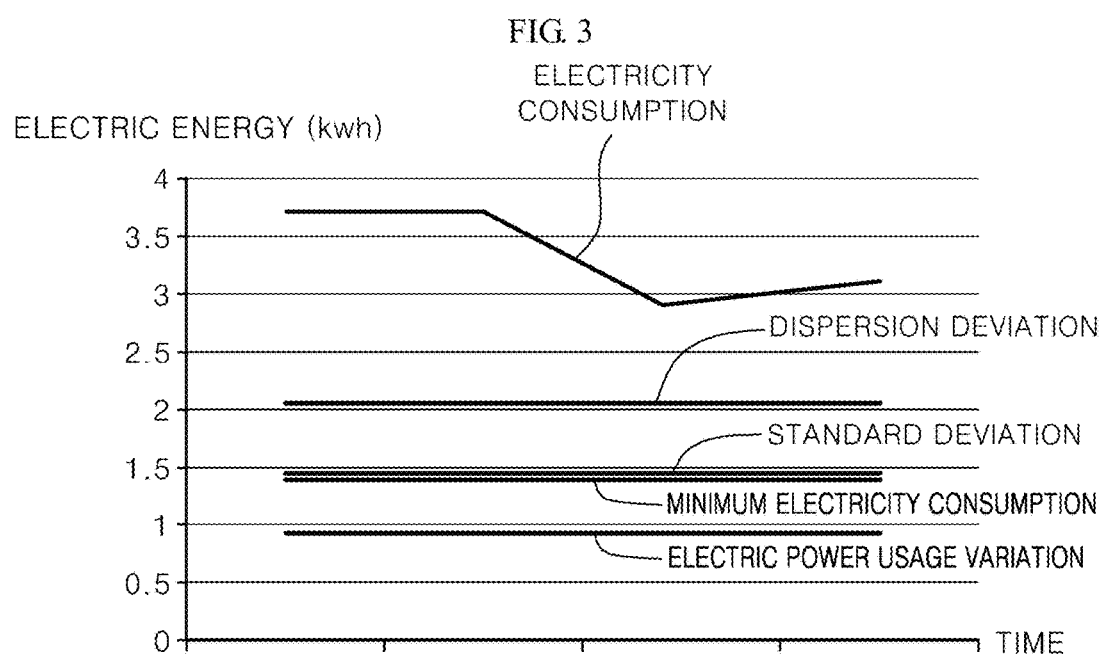
FIG. 3 is a first diagram illustrating electric energy information according to an embodiment of the present disclosure.

As shown in FIG. 3, the server 20 may generate an electricity consumption, standard deviation electric energy, dispersion deviation electric energy, a minimum electricity consumption, an electricity consumption variation on the basis of the electric energy measured at the electricity meter to provide them to the user.

The minimum electricity consumption means lowest electricity consumption within a predetermined period. For example, when lowest electricity consumption, that is, 1.3 kWh, on March $13^{th}$ is minimum electricity consumption for one month from March $1^{st}$ to March $31^{st}$, 1.3 kWh may be provided to the user as the minimum electricity consumption.

Figure 4:
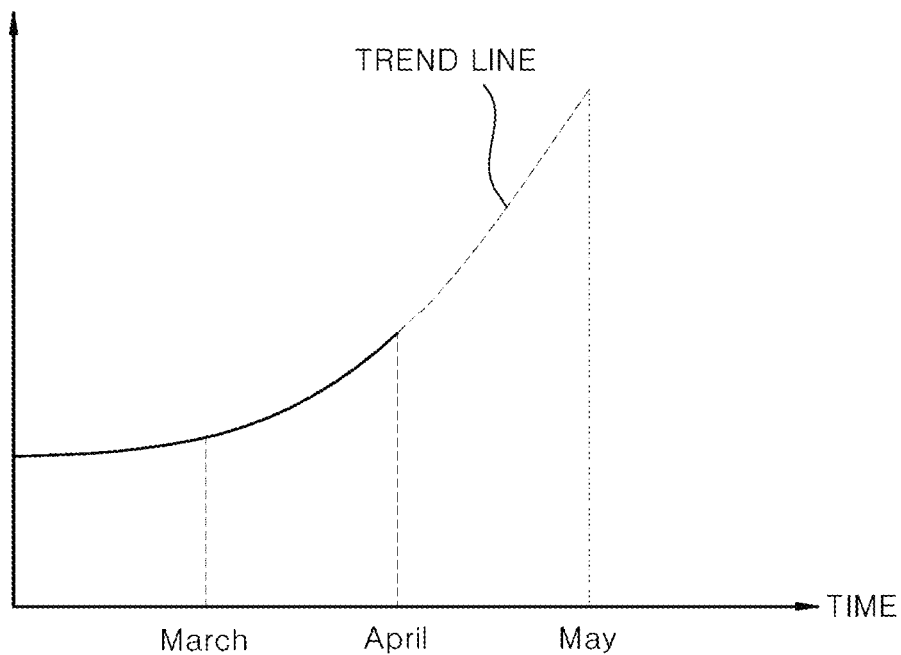
FIG. 4 is a second diagram illustrating electric energy information according to an embodiment of the present disclosure.

As shown in FIG. 4, the server 20 may generate a trend line for a future electric energy anticipated usage pattern based on the electric energy measured at the electricity meter to provide the trend line to the user.

For example, on the basis of electric energy used in March and April, a trend line in May for anticipated electric energy consumption may be generated. As shown in FIG. 4, since the electric energy is increased in April as compared to March, a trend line in May for the anticipated electric energy consumption may be generated to be gradually increased more and more as compared to April. The user may recognize to reduce a usage of electric energy with reference to the trend line shown in FIG. 4.

Figure 5:
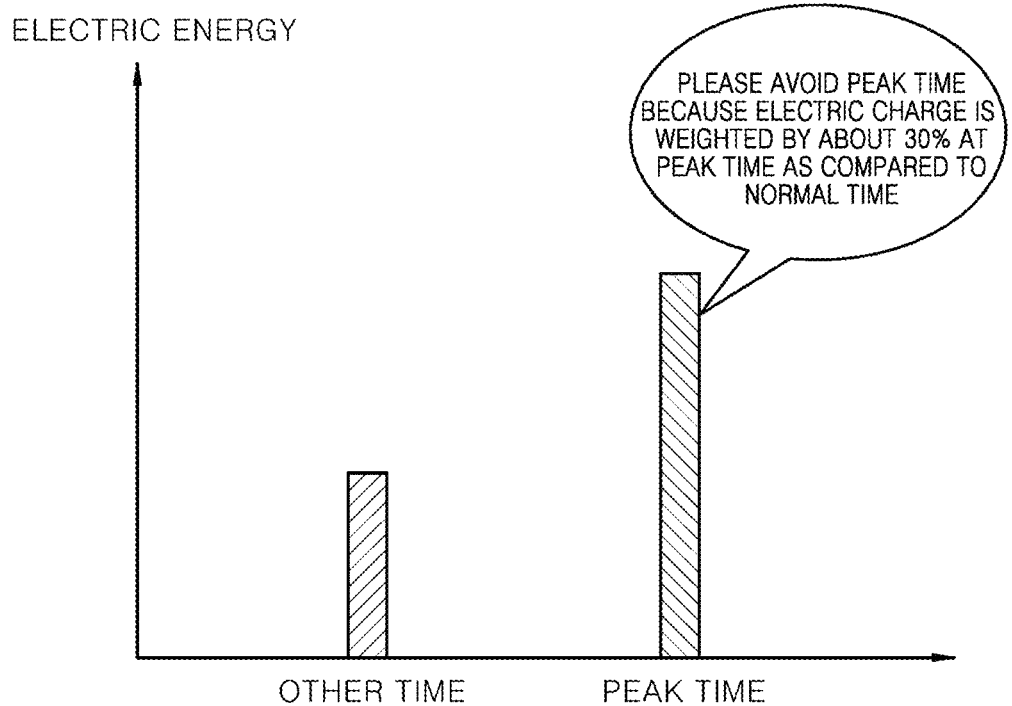
FIG. 5 is a third diagram illustrating electric energy information according to an embodiment of the present disclosure.

As shown in FIG. 5, an electric energy usage pattern of the user may be analyzed based on the measured electric energy to generate and show a graph regarding electric energy of a peak time, for example, from 2 p.m. to 5 p.m., and other time to the user. If the user may use more electric energy in the peak time as compared to the other time, message information requesting to avoid the peak time may be generated and provided to the user. As described above, the user may be helped to grasp own electric energy usage status and reduce electric charges by avoiding the peak time.

Besides the described above, the server 20 may analyze an electric energy usage pattern of the user to differentiate electric charges according to a progressive stage system, a peak time, a late night and the like. Consequently, a plan for reducing electric energy may be provided.

Alternatively, the server 20 may compare electric energy of the buildings 10 with each other based on electric energy information of each of the buildings 10. The server 20 may provide information regarding the comparison result to the user. Through the comparison result, the user may easily grasp whether or not the user uses more electric energy as compared with a user of other building 10. Consequently, when using more electric energy, the user may attempt to reduce electric energy.

Heretofore, it has been described that the server 20 analyzes electric energy to provide the analyzed result to the user, but it is not limited thereto.

Figure 6:
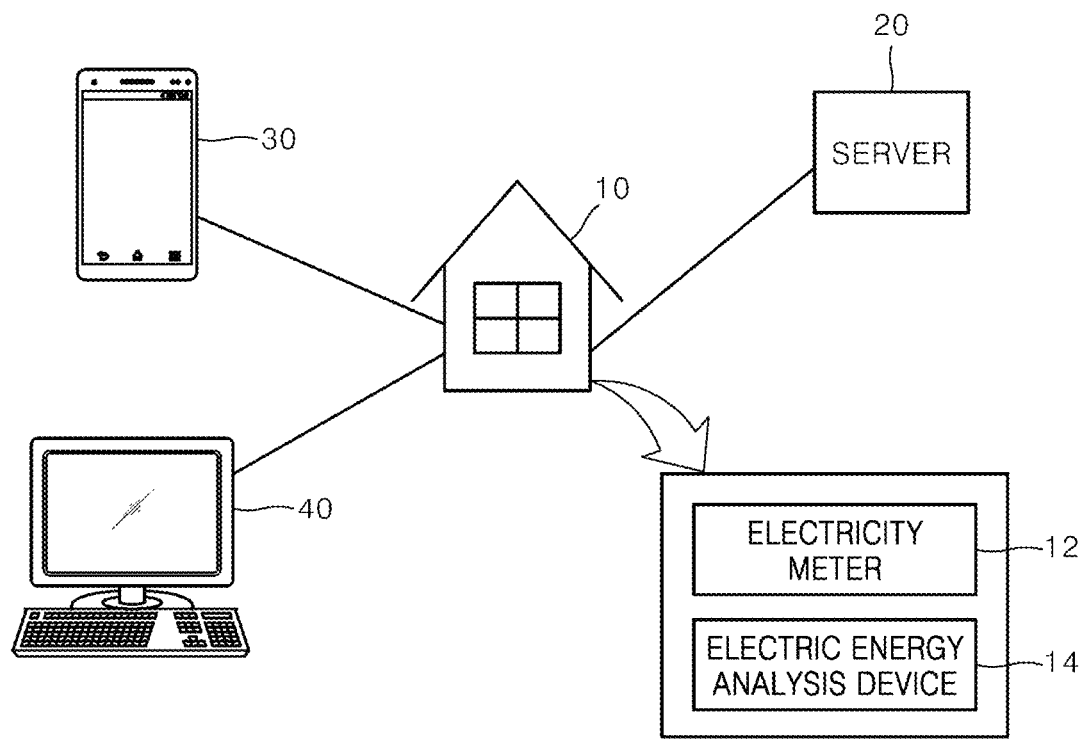
FIG. 6 is a diagram illustrating an electric energy information provision system according to a second embodiment of the present disclosure.

FIG. 6 is a diagram illustrating an electric energy information provision system according to a second embodiment of the present disclosure.

Instead of the server 20, a device capable of analyzing electric energy, for example, an electric energy analysis device 14 together with an electricity meter 12 may be installed at the building 10.

The electricity meter 12 may be installed at an indoor usage load.

In such a case, the electric energy analysis device 14 may analyze electric energy measured at the electricity meter 12 to generate and store electric energy information. The electric energy analysis device 14 may provide the electric energy information in response to an electric energy analysis result request of the user. The electric energy analysis device 14 may be capable of communicating with the server 20 to transmit the generated electric energy information thereto.

The server 20 may store the generated electric energy information together with identification information of the user.

The electricity meter 12 installed at the indoor usage load of the building 10 and the electric energy analysis device 14 may be referred to as an electric energy information provision apparatus.

On the other hand, the electricity meter 12 and the electric energy analysis device 14 may be separately provided.

Consequently, with the electric energy information provision apparatus and the terminals 30 and 40, an electric energy information provision system may be configured.

The generated electric energy information may be transmitted to the terminals 30 and 40 to be displayed thereon. For this purpose, the terminals 30 and 40 may include a display unit for displaying the electric energy information.

The electric energy information provision system may further include a renewable energy source and an energy storage system (hereinafter, referred to as ESS).

As a renewable energy source, wind power, solar power, tidal power, or the like may be used. The ESS may store energy source generated from the renewable energy source.

In summary, since the electricity meter 12 and the electric energy analysis device 14 are provided at the building 10, the electric energy information may be generated by the electric energy analysis device 14 installed at the building 10 without being generated at the server 20. The electricity meter 12 and the electric energy analysis device 14 may be connected to each other through a network cable. Therefore, generation of the electric energy information of each of the buildings 10 may not be performed at the server 20 so that a load of the server 20 may be reduced. Also, the electric energy information may be generated in real time at the electric energy analysis device 14 of each of the buildings 10 so that the user may rapidly access to information. In addition, since the electric energy analysis device 14 is inside the building 10, security maintenance of the generated electric energy information may be helpful.

In the electric energy information provision system according to the second embodiment, the disclosed contents in association with the described above and FIGS. 2 to 5 may be directly applicable.

According to another embodiment, by displaying a variety of information related to the electric energy as described above instead of simply showing electric energy over time, an electric energy usage custom of the user may be improved and also a reduction of electric energy of the user may be guided.

The detailed description should not be construed as limiting all aspects and should be construed as an illustration. The scope of the present disclosure should be determined by reasonably interpreting the appended claims, and all modifications within an equivalent range of the present disclosure will be included in the scope thereof.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. Various components illustrated in the figures may be implemented as hardware and/or software and/or firmware on a processor, ASIC/

FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. An electric energy information provision system comprising:
   a server configured to perform a user authentication process;
   an indoor usage load;
   an electricity meter installed in the indoor usage load to measure an electric energy, and
   an electric energy analysis device configured to analyze the measured electric energy to generate electric energy information and provide the electric energy information to a user in response to a request,
   wherein the electric energy analysis device is configured to transmit the electric energy information to terminals, an electricity unit price per time slot information preset in the server is changed to a new setting using the terminals when the user authentication process is successfully completed, and the electric energy analysis device generates a trend line regarding an anticipated future electric energy usage pattern based on the measured electric energy,
   wherein the electric energy analysis device is further configured to generate a message of requesting the user to reduce consumption of electric energy during a peak time when electric energy is used more at the peak time as compared to other times,
   wherein the electric energy information includes a variation status, a standard deviation analysis result, a dispersion deviation analysis result, trend line information, past accumulative electric energy variation information, anticipated future accumulative electric energy variation information, an electric energy usage status diagnosis, and electric energy reduction plan information, and
   wherein the electricity meter and the electric energy analysis device are provided inside the same building, and the electricity meter and the electric energy analysis device are connected to each other through a network cable.

2. The electric energy information provision system of claim 1, wherein the indoor usage load is an electronic home appliance.

3. The electric energy information provision system of claim 1, wherein the electric energy analysis device is further configured to analyze an electric power usage pattern of the user based on the measured electric energy.

4. The electric energy information provision system of claim 1, further comprising: an indoor renewable energy source configured to generate indoor renewable energy; and an energy storage device configured to store the generated indoor renewable energy.

5. The electric energy information provision system of claim 1, wherein the electric energy analysis device includes a display unit and is further configured to display the analyzed information through the display unit.

* * * * *